Figure 1:
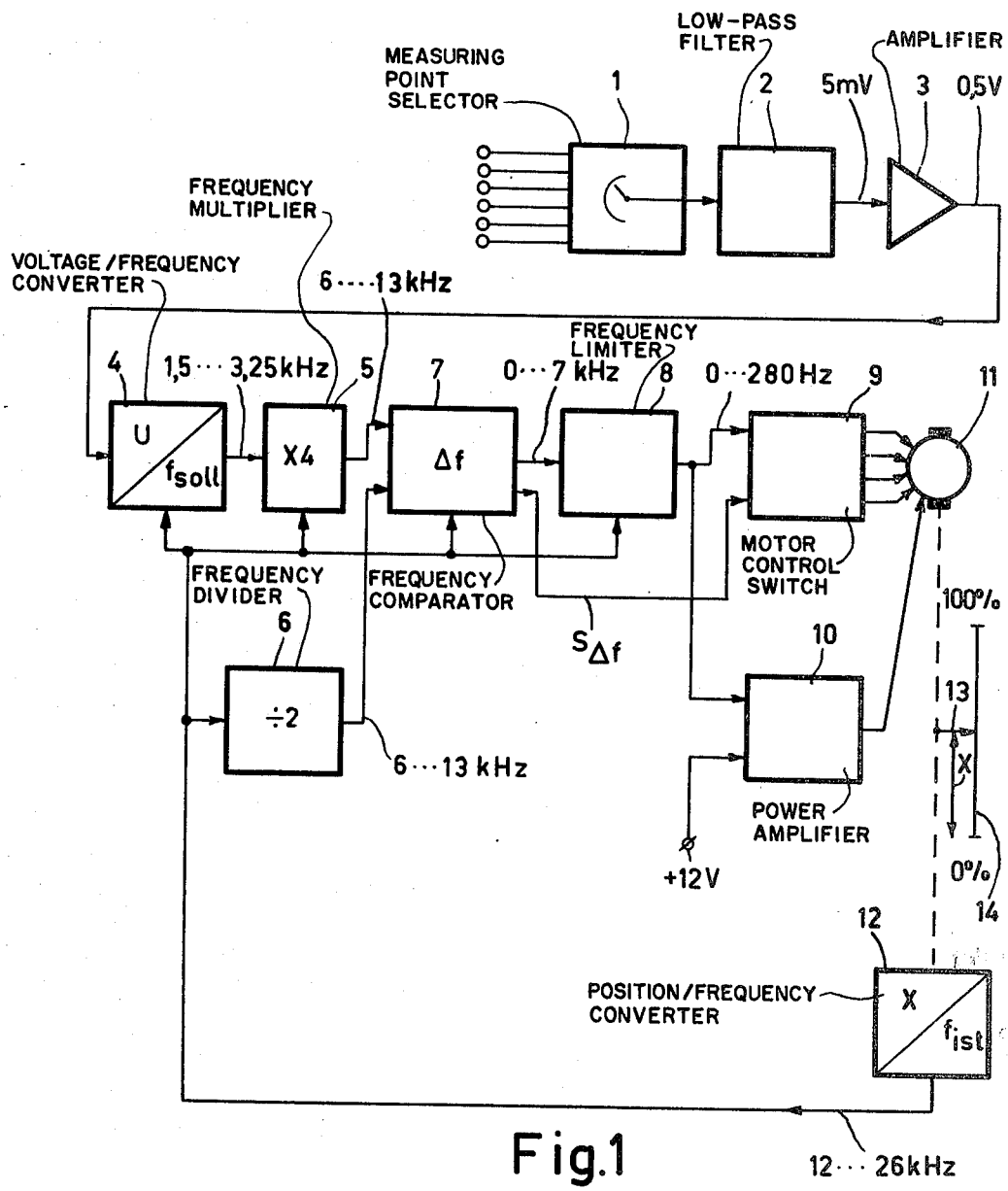

United States Patent [19]

Novak

[11] 3,970,931
[45] July 20, 1976

[54] APPARATUS FOR RECORDING ELECTRICAL QUANTITIES

[75] Inventor: Ivan Novak, Kassel, Germany

[73] Assignee: U.S. Philips Corporation, New York, N.Y.

[22] Filed: July 5, 1974

[21] Appl. No.: 486,221

[30] Foreign Application Priority Data
June 30, 1973 Germany............................ 2333413

[52] U.S. Cl............................... 324/99 R; 318/685; 324/120
[51] Int. Cl.² ................... G01R 17/06; G01R 19/26
[58] Field of Search................ 324/99 R, 99 D, 120, 324/78 N, 78 D, 78 R, 100; 318/685, 318, 326, 329

[56] References Cited
UNITED STATES PATENTS

| 3,094,875 | 6/1963 | Fluegel | 324/120 |
| 3,228,025 | 1/1966 | Welch | 324/99 D |
| 3,418,547 | 12/1968 | Dudler | 318/685 |
| 3,619,757 | 11/1971 | Ioeger | 318/685 |

Primary Examiner—R. V. Rolinec
Assistant Examiner—Ernest F. Karlsen
Attorney, Agent, or Firm—Frank R. Trifari; Bernard Franzblau

[57] ABSTRACT

A method and an apparatus are described for indicating and/or recording electrical quantities, the desired and actual values being converted into pulses whose repetition frequencies are proportional to the actual and desired quantities. The difference between the two pulse frequencies controls a stepping motor, whose shaft drives the indicating or recording element.

16 Claims, 19 Drawing Figures

APPARATUS FOR RECORDING ELECTRICAL QUANTITIES

The invention relates to a method of indicating and/or recording electrical quantities and to an indicating-recording apparatus embodying said method. An electrical quantity, after amplification, is applied, as the case may be via a measuring-point selector, to a servomotor whose shaft moves an indicating or recording element over a scale or a record carrier in such a way that the influence of a reference quantity which depends on the position of the indicating element is compensated.

Such methods and apparatus are generally known. For example, an external resistance (resistance thermometer) is then compared with an internal resistance (reference resistance) or an external voltage (thermoelement) with an internal voltage (reference voltage), and in the event of mutual deviations of the quantities to be compared the internal quantity (reference resistance, reference voltage) is varied with the aid of the servomotor until the quantities are equal. In this respect it is known to vary the internal quantity with the aid of a tapping which slides over a resistance wire. The wear on the resistance wire and the wiper is then unfavourable. Also it is difficult to maintain a constant and minimal contact resistance between the wire and the wiper.

An object of the invention is therefore to provide a method and an apparatus of the type mentioned in the preamble without the use of components which are subject to wear and which adversely affect the reliability and the measuring accuracy.

In order to accomplish this object, in the method according to the invention, the amplified electrical quantity is first converted into a first frequency which is proportional to its amplitude (desired frequency), after which said frequency is compared with a second frequency which depends on the instantaneous position of the indicating element (actual frequency). The difference between the first (desired) frequency and the second (actual) frequency then controls a stepping motor which operates as a servomotor.

A recording apparatus which operates in accordance with said method comprises a voltage/frequency converter, a comparator circuit, a frequency limiter, a motor-control switch, a stepping motor whose shaft is connected to the pointer which is movable over the scale, and a position/frequency converter controlled by the pointer position and whose output frequency is supplied to the comparator circuit.

Figure 2:
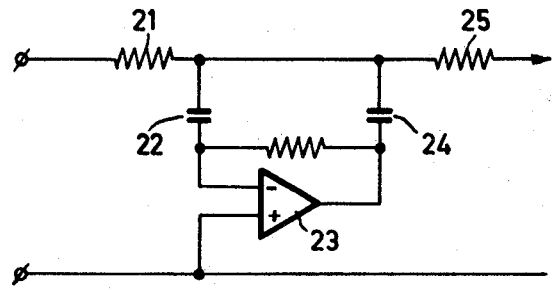
Figure 3:
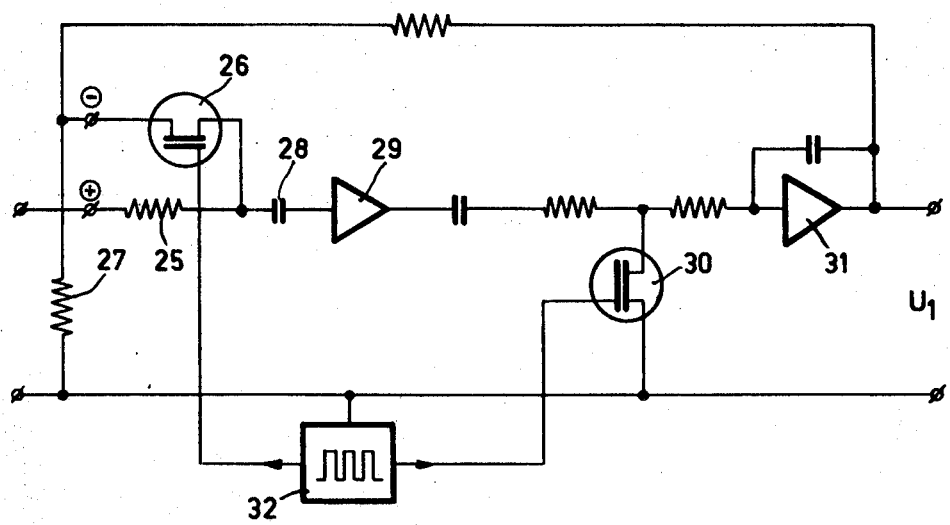
Figure 4:
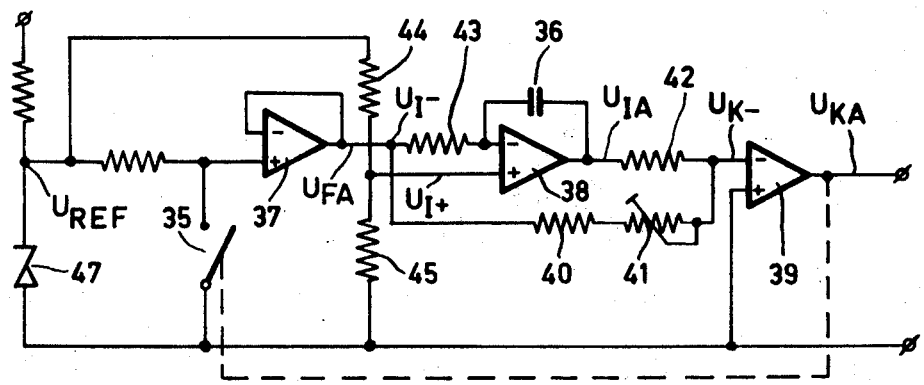
Figure 5:
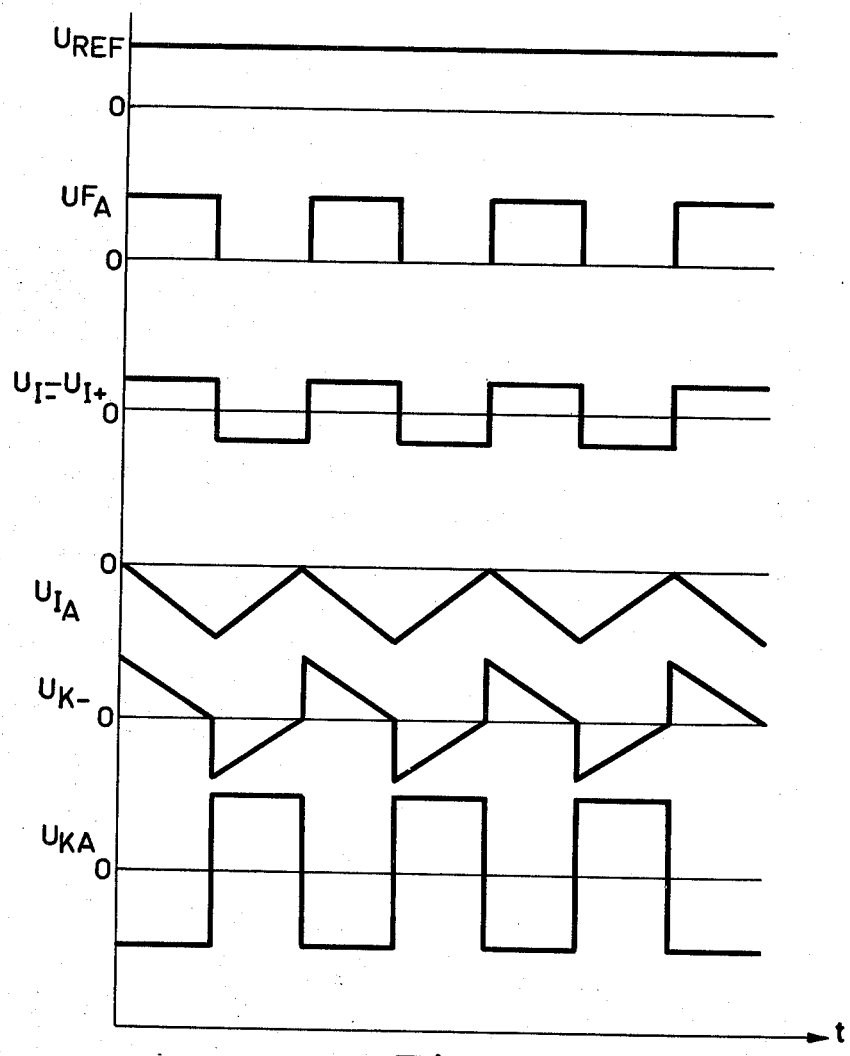
Figure 6:
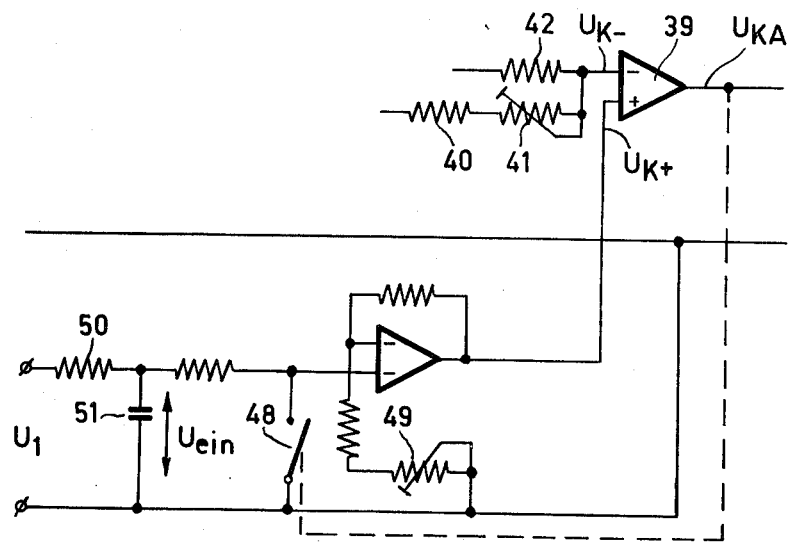
Figure 7:
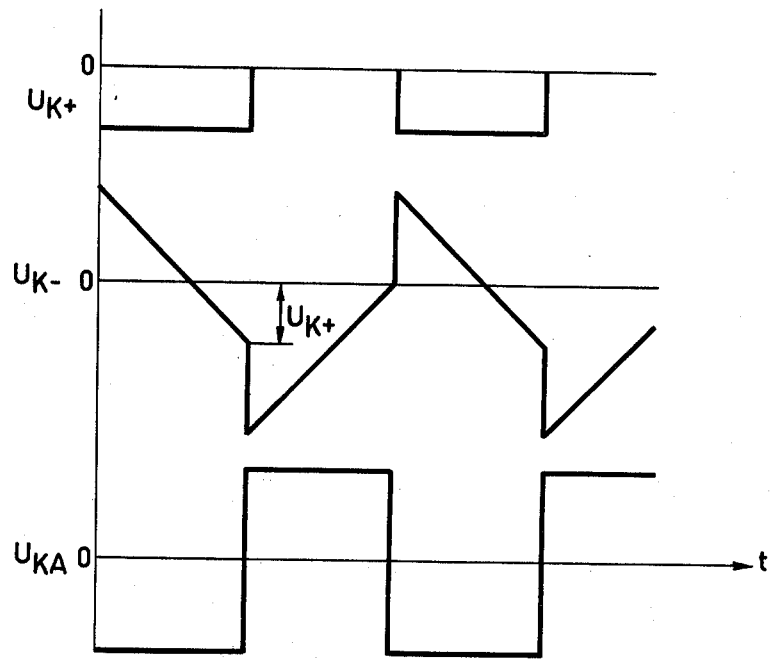
Figure 8:
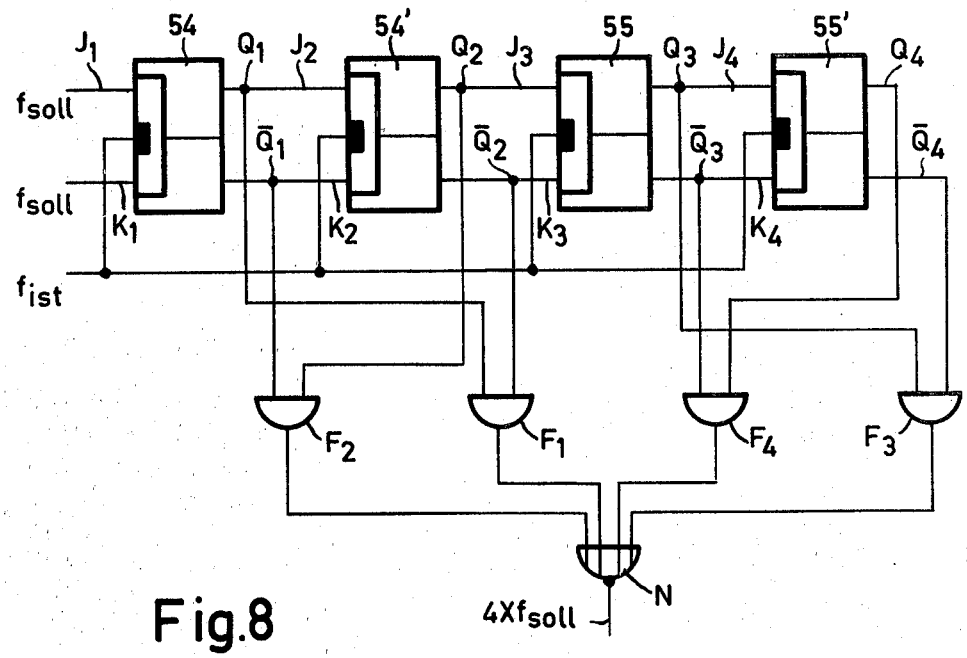
Figure 9:
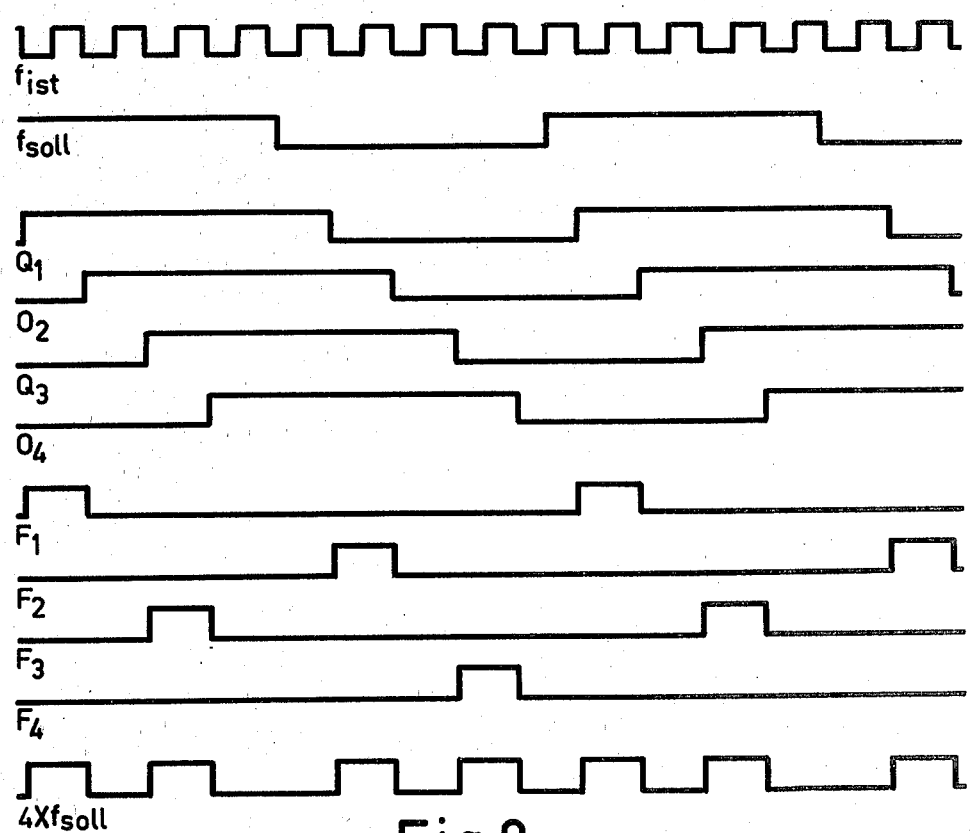
Figure 10:
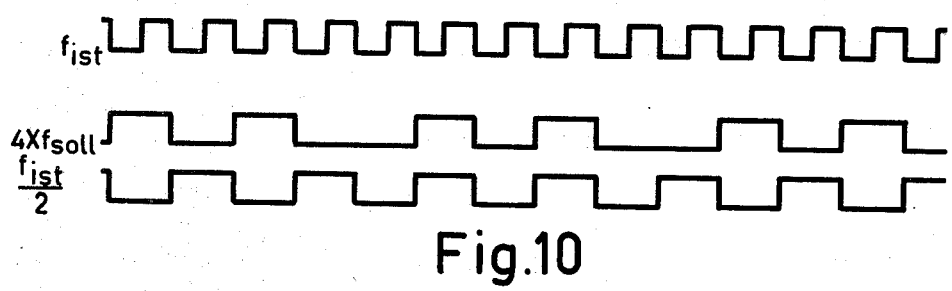
Figure 11:
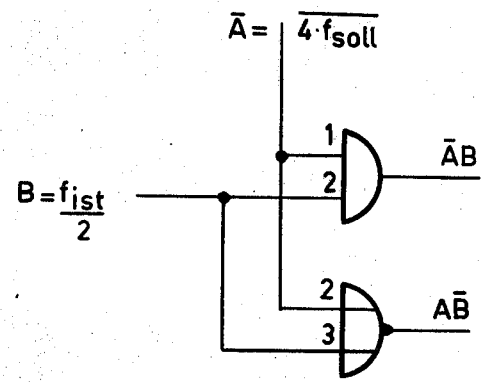
Figure 12:
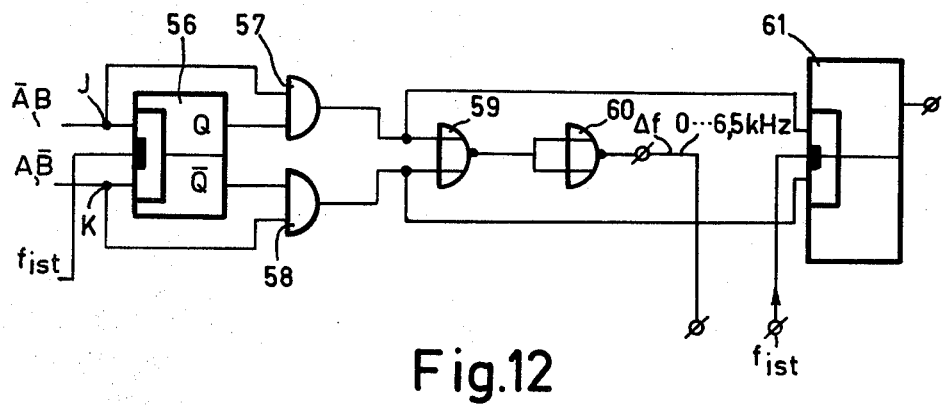
Figure 13:
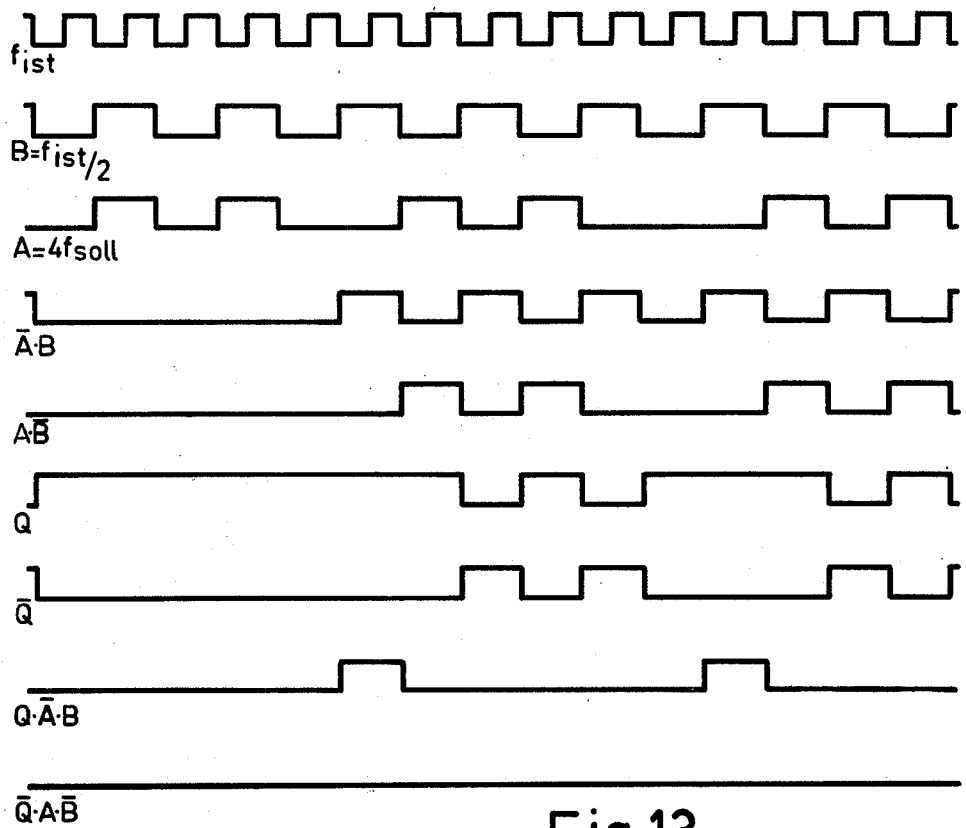
Figure 14:
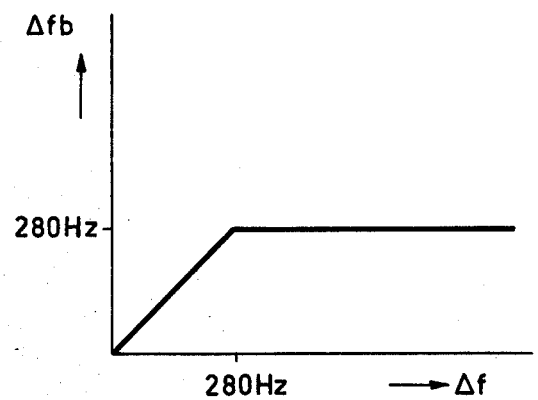
Figure 15:
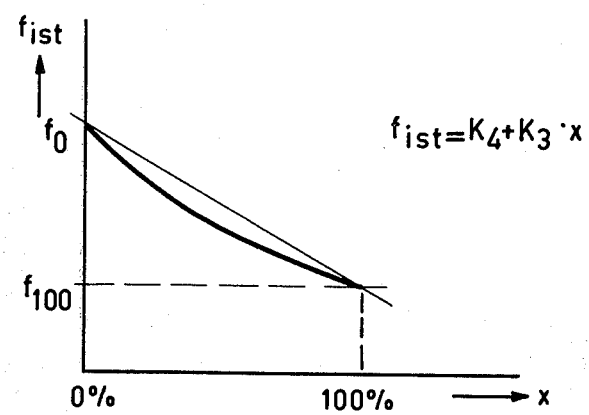
Figure 16:
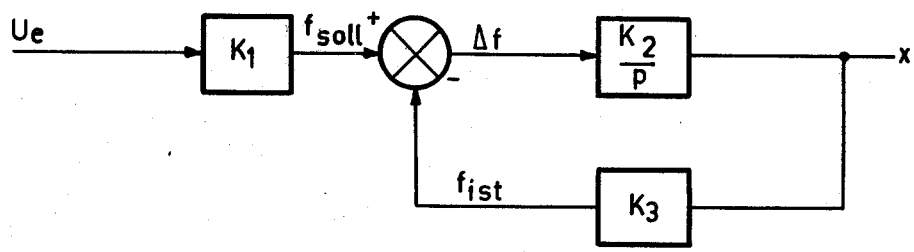
Figure 17:
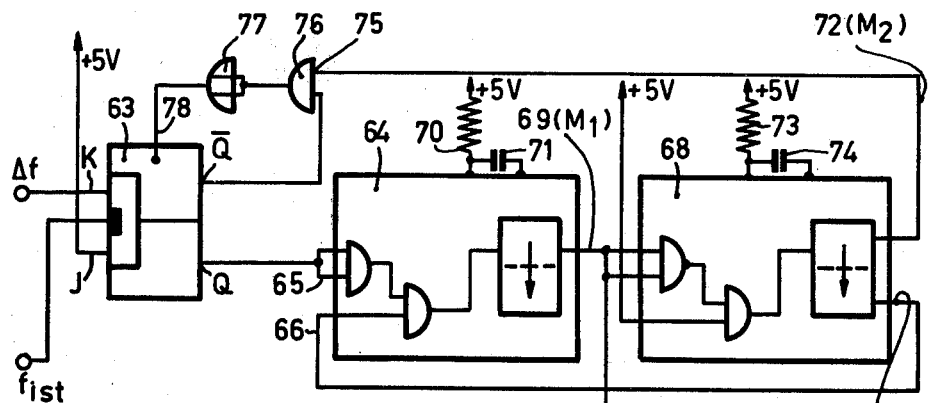
Figure 18:
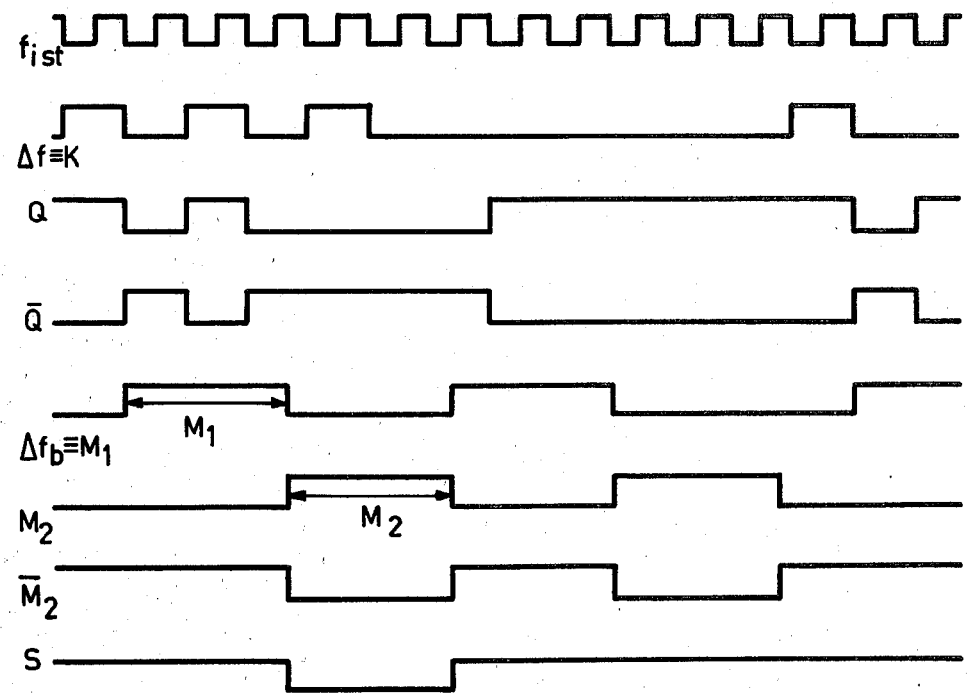
Figure 19:
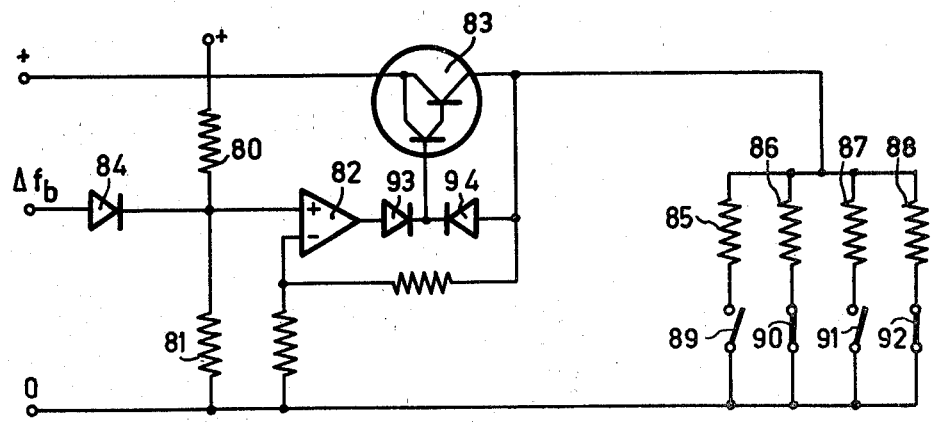

The invention will be explained in more detail with reference to the accompanying drawing, in which:

FIG. 1 shows a block diagram in explanation of the method according to the invention and of a suitable indicating or recording apparatus respectively, FIG. 2 shows the circuit diagram of an active filter, FIG. 3 shows the circuit of a measuring voltage chopper-amplifier, FIG. 4 shows the circuit diagram of a voltage/frequency converter, FIG. 5 represents the voltage variations in the circuit of FIG. 4, FIG. 6 is a detailed diagram relating to the converter of FIG. 4, FIG. 7 represents voltage variations in the circuit of FIG. 6, FIG. 8 shows a circuit for quadrupling a frequency, FIG. 9 represents voltage variations in the circuit of FIG. 8, FIG. 10 represents an addition of the actual frequency, the quadruple of the desired frequency and half the actual frequency, FIG. 11 represents an anticoincidence circuit, FIG. 12 represents a difference-forming circuit, FIG. 13 represents voltage variations in the circuit of FIG. 12, FIG. 14 shows a graph of a frequency limiter, FIG. 15 is a diagram in explanation of linearization in a control circuit, FIG. 16 shows a circuit diagram of a linearized control circuit, FIG. 17 is a circuit diagram for the frequency limiter, FIG. 18 shows voltage variations in the circuit of FIG. 17, and FIG. 19 shows a circuit diagram of a power amplifier for a stepping motor.

The voltages obtained at one or more measuring points, for example from thermo-elements, are passed via a measuring point selector 1 to the input of an active filter 2, which operates as a low-pass filter. Said filter rejects all disturbing frequencies above approximately 2 Hz. The filter output is connected to the input of an amplifier 3, which amplifies the input voltage from approx. 5 mV to 0.5 V and subsequently transfers it to a first input of a voltage/frequency converter 4. Said converter converts the input voltage of 0 ... 0.5 V into a square-wave voltage with a frequency between 1.5 ... 3.25 kHz, the period of the oscillation being linearly proportional to the input direct voltage. Said square-wave voltage reaches a first input of a quadrupler circuit 5, at the output of which a frequency of 6 ... 13kHz is available. Said quadrupled frequency is now fed to a first input of a comparator circuit 7. In a method to be described hereinafter, a second alternating voltage in the same frequency range of 6 ... 13 kHz is fed to a second input of the comparator circuit 7. At a first output of the comparator circuit 7 a difference frequency of 0 ... 7 kHz is now available, while a direction-dependent signal is available at a second output of the comparator circuit.

The difference frequency, which may vary between 0 and 7 kHz, is applied to a first input of a frequency limiter 8. Said limiter stage serves to limit the difference frequency of 0 ... 7 kHz to 0 ... 280 Hz, which frequency (i.e., 0 ... 280 Hz) is simultaneously fed to a first input of a motor control switch 9 and a first input of a power amplifier 10. To a second input of the motor control switch 9 the direction-of-rotation signal S $\Delta f$ is applied. The outputs of the control switch and the power amplifier, in known manner, control a stepping motor 11, to the shaft of which an indicating element 13 is connected which can be moved over a scale 14. Also connected to the indicating element 13 is the core of a contactless position/frequency converter 12, whose output frequency $f_{ist}$, depending on the position of the indicating element, supplies a frequency between 12 ... 26 kHz. The latter frequency reaches a second input of the voltage/frequency converter 4, the quadrupler 5, the comparator 7 and the limiter 8, as well as an input of a frequency divider 6, in which said frequency is halved, i.e., reduced to a frequency within the range of 6 ... 13 kHz. Said halved frequency is also fed to the comparator 7. It is to be noted once again that both in the case of conversion of the input voltage into a frequency and in the case of conversion of the position of the indicating element 13 into a frequency the voltage and position variations are proportional to the periods, whose reciprocals, i.e., the frequencies, are compared with each other. Non-linearities are then eliminated owing to the formation of the reciprocals.

In the active filter of FIG. 2, which operates as a low-pass filter, all alternating voltages above 2 Hz are rejected without the d.c. component being influenced. The disturbing alternating voltage is fed via a resistor 21 and a capacitor 22 to the inverting input of an operational amplifier 23, in which said voltage is amplified accordingly and 180° phase-shifted and subsequently, via a capacitor 24, counteracts the original disturbing voltage. Via a resistor 25 the "clean" direct voltage reaches a MOS-FET 26 (FIG. 3) which operates as a chopper, which chops the difference between the input voltage and the output voltage which is fed back via a resistor 27. Said differential voltage is only a few microvolts.

Via a capacitor 28, only the a.c. component reaches the input of an operational amplifier 29 and is then passed through a further MOS-FET 30, which operates as a phase-sensitive rectifier, and is smoothed in a further operational amplifier 31 which is connected as an integrator.

As said integrator circuit by itself is not stable, the inverting input of the complete amplifier should be provided with negative feedback.

The two MOS-FET's 26 and 30 are controlled by an astable multivibrator 32 whose frequency is approx. 700 Hz.

The direct voltage which is amplified by the amplifier 3 is converted into squarewave pulses in the voltage-/frequency converter. The period of these pulses is linearly proportional to the input voltage of the converter. The function is explained with reference to FIG. 4, while the variation in time is represented in FIG. 5.

It is assumed in FIG. 4 that a switch 35 is open and a capacitor 36 is discharged. A positive reference voltage $U_{REF}$ appears at the input of a voltage follower 37. As the output of an integrator 38 is at first zero (the capacitor 36 is discharged), the reference voltage $U_{REF}$ which is reduced by a voltage divider 40, 41, 42 will appear at the minus input of a comparator 39. As the plus input of the comparator 39 is zero, its output will be negative. The full reference voltage appears across a resistor 43, which with the capacitor 36 forms the integration time constant of the integrator 38. The plus input of the integrator 38 is held at half the reference voltage by a voltage divider 44, 45. Consequently, a voltage difference equal to half the reference voltage is available between the two inputs of the integrator 38.

During the integration process of the integrator 38 its output becomes more and more negative, which results in the positive voltage at the minus input of the comparator decreasing continuously. Once it is smaller than zero (i.e., negative), the comparator 39 changes over, its output becomes positive and the switch 35 is closed. As a result, the output of the voltage follower 37 becomes zero. The polarity of the voltage between the two inputs of the integrator 38 is then reversed. Moreover, only the negative output voltage of the integrator 38, which is attenuated by the resistors 40, 41, 42, acts at the minus input of the comparator 39. As only the polarity of the voltage between its inputs, but not the magnitude thereof changes, it now integrates at the same rate but in the other direction. This means that the negative voltage at its output is reduced at the same rate. As a result, the minus input of the comparator 39 also becomes less and less negative. Once it has exceeded the zero line, i.e., as soon as the capacitor 36 is fully discharged, the comparator 39 changes over. Its output then becomes negative and the switch 35 opens. Subsequently, the process is repeated as is shown in FIG. 5.

Thus, a squarewave voltage is obtained at the output of the comparator 39. The period can be changed by changing the ratio of the resistors 40 and 41 to the resistor 42.

When the plus input of the comparator 39 is not combined with zero, but with a variable negative voltage in accordance with FIG. 6, which is switched synchronously with the reference voltage $U_{REF}$ by a second switch 48 which is also controlled by the comparator output, this will result in the integrator 38 requiring more time to reduce the minus input of the comparator to the voltage $U_{K+}$ and subsequently raise it to zero, as is shown in FIG. 7. This means that the period can be controlled with the aid of the switched input voltage of the converter. By means of the variable resistors 41 and 49 the period at the beginning and at the end of the span of the pointer can be adjusted accurately, thus enabling tolerances of the frequency-determining components and of the inductive transducer, i.e., of the position/frequency converter, to be compensated. The reference voltage $U_{REF}$ required for conversion is provided by a zenerdiode 47 (FIG. 4). The switches 35 and 48 are semiconductor switches. To the plus input of the comparator synchronisation pulses are applied whose magnitude does not influence the described function, but suffices to maintain the desired frequency of the converter in phase with the actual frequency of the position-transducer in the compensated condition.

The quadrupler 5 of FIG. 1 is represented more elaborately in FIG. 8. In said circuit the output frequency $f_{soll}$ of the voltage/frequenncy converter 4 is quadrupled, using the actual frequency $f_{ist}$ of the position-transducer as trigger frequency, and synchronized with said trigger frequency. As a result, pulses will appear at the output of the quadrupler of FIG. 8 whose duration exactly equals the period of the transducer oscillation and whose number per unit of time is four times greater than the desired frequency, i.e., the output frequency of the voltage/frequency converter 4, which is available at the input of the quadrupler circuit 5. Said circuit first of all consists of four J-K master-slave flip-flops 54, 54' and 55, 55'. In said circuits the logic state of the outputs ($Q_i$, $Q_i$) at an arbitrary instant not only depends on the state of the inputs ($J_i$, $K_i$), but also on the state of the memories at the same instant. Furthermore, the device of FIG. 8 comprises four AND-gates $F_1$, $F_2$, $F_3$ and $F_4$. The following equations are valid to said four AND-gates:

$F_1 = Q_1 \cdot \overline{Q_2}$,
$F_2 = \overline{Q_1} \cdot Q_2$,
$F_3 = Q_3 \cdot \overline{Q_4}$, and
$F_4 = \overline{Q_3} \cdot Q_4$.

Each transition from "0" to "1" results in a pulse at the output $F_1$ after the next clock pulse arrives and in a pulse at the output $F_3$ after two more clock pulses. Both pulses have a duration equal to the clock period.

Each transition from "1" to "0" at the input $J_1$ results in a pulse at the output $F_2$ (FIG. 9) after the next clock pulse and in a pulse at the output F₄ after two more clock pulses. The two pulses again have a duration equal to the clock period.

Each change of state at the input consequently results in two consecutive pulses. Therefore, a pulse at the input, which may be regarded as a dual change of state, results in four time-shifted pulses, which may be combined at one line by means of an OR-gate or by means of a NOR-gate. For this it is necessary that the interval between the transitions is at least three clock periods, or in other words: the actual frequency should at least equal six times the desired frequency.

When said requirement is not met, the pulses of the one transition coincide in time with those of the other transition, so that the input frequency is not quadrupled. As this might result in incorrect compensation, a delay element has been included between the preamplifier and the voltage/frequency converter, which element consists of a resistance 50 and a capacitance 51, whose time constant is proportioned so as to prevent a too rapid change of the converter frequency $f_{soll}$. In the multiplier circuit the frequency of the voltage/frequency converter 4 (FIG. 1) is quadrupled, i.e., transposed to the frequency range of approx 6 . . . 13 kHz, the pulse duration being independent of the frequency and always corresponding to the period of the actual frequency. Thus, by halving the actual frequency in the stage 6 (FIG. 1), the actual frequency is also transposed to the same range of 6 . . . 13 kHz. Both frequencies are now in the same frequency range; they are synchronized with each other and have the same pulse lengths, as is shown in FIG. 10.

The difference between the two frequencies is determined in the stage 7 (FIG. 1). Said stage first of all comprises an anticoincidence stage (FIG. 11) followed by a counting stage in accordance with FIG. 12, in which the difference frequency is produced.

The pulses at the lines $\overline{A}$ B or A $\overline{B}$ always have a length of only one clock period $T_{ist}$. This means that they are always spaced at least two clock periods apart. However, a pulse at one line may already be followed by a pulse at the other line in the next clock period (FIG. 13). The J-K flip-flop 56 is triggered by the actual frequency.

When, at the instant n, i.e., before the $n^{th}$ clock pulse, a pulse reaches the input J, the output Q becomes 1 and the output $\overline{Q}$ becomes 0 after said $n^{th}$ clock pulse. When during the subsequent clock pulses the two inputs (J, K) remain 0, the state of the outputs Q and $\overline{Q}$ does not change, as is shown in FIG. 13. This means: the output Q subsequently remains 1. When a pulse now reaches the input K, the output Q becomes 0 and the output $\overline{Q}$ becomes 1 upon receipt of the next clock pulse. However, when instead of said pulse a new pulse reaches the input J, the output of the AND-gate 57 which is included thereafter becomes 1, because the other input of said gate is also maintained at 1 by the output Q of the flip-flop 56. Similarly, each further pulse at a line $\overline{A}$ B is transferred, but only when the line A $\overline{B}$ has been continuously 0. As this circuit arrangement is symmetrical, the reverse applies to the line A $\overline{B}$ and the lower input of the second AND-gate 58. As is shown in FIG. 12, the upper AND-gate 57 supplies the difference frequency when half the actual frequency is greater than four times the desired frequency, while the lower AND-gate 58 supplies the difference frequency when the actual frequency is smaller than eight times the desired frequency.

When the actual frequency equals eight times the desired frequency, the two AND-gates 57 and 58 remain at 0 because all pulses cancel each other either in the anticoincidence circuit or in the counter.

After the AND-gates 57 and 58 a first NOR-gate 59 is included, which is followed by a second NOR-gate 60 which is connected as an inverter, at whose output the difference frequency $\Delta f$ is available.

However, further information is required about which of the two compared frequencies is higher or lower respectively, because the direction of rotation of the stepping motor depends on this. Said information is taken from a further J-K flip-flop 61, whose inputs are connected to the inputs of the first NOR-gate 59 and which flip-flop is also synchronized by the frequency $f_{ist}$.

When one of the two AND-gates 57 and 58 respectively supplies pulses, the corresponding output of the flip-flop 61 becomes 1 until the other AND-gate 58 and 57 respectively no longer supplies any pulses. This means that the logic condition at the output of the flip-flop 61 provides the additional information about which of the two frequencies is higher, half the actual frequency or the quadruple of the desired frequency. Said output of the flip-flop 61 is connected to an input of a control switch 9 (FIG. 1) of known design and controls the sequence in which the lines of the stepping motor are reversed, and thus the direction of rotation of said motor.

At the output of the NOR-gate 60 the difference frequency $\Delta f$ of 0 . . . 7 kHz is available. When it is assumed that the stepping motor which is employed can handle a maximum of only 300 pulses per second for the obtaining load, the prevailing difference frequency should be limited to a maximum of said value and preferably to a value which is slightly lower. By way of example it is assumed that said maximum frequency is 280 Hz, as is shown in FIG. 14. In said Figure the difference frequency $\Delta f$ is plotted on the horizontal axis and the limited difference frequency $\Delta fb$ on the vertical axis, the latter frequency being 280 Hz.

It seems to be obvious to select a frequency which is equal to the maximum stepping frequency of the motor as the maximum difference frequency. However, in view of the dynamic behaviour of the starting process this choice appears to be ineffective. If the hyperbola (for this cf. FIG. 15)

$$f_{ist} = \frac{1}{T_0 + k_5 x},$$

in which x represents the position of the indicating element, is replaced by its secant, this would yield — without frequency limitation — the following linearized control circuit for the zone around the operating point after normalization (cf. FIG. 16).

The constant $K_1$ characterizes the $U_e/T_{soll}$ converter, the constant $K_3$ the inductive transducer and the factor $K_2/p$ allows for the integrating behaviour of the stepping motor.

For a step function at the input $U_e(t) = U_{3_1} \cdot 1(t)$ an exponential response is obtained in this case. As the relationship between the position $x(t)$ of the indicating element and the number of steps S(t) required to attain said position is linear, the following equation applies:

$$S(t) = S_1 \left(1 - e - \frac{t}{\tau}\right),$$

where $S_1$ is the number of steps required to reach position $x_1$. As in this control circuit the difference frequency $\Delta f$ is not limited, the maximum speed, i.e., the initial speed at the instant $t = 0$, should not exceed the previously assumed 280 steps per second.

In the case of a variation of the input voltage $U_e$ from 0 to 100 % (or vice versa) approx. 570 steps are required to move the indicating element also from 0% to 100%. This yields the time constant $\tau$.

To obtain a maximum deviation of 0.1%, allowance must be made for 7 $\tau$. This means that at an initial speed of 280 steps per second, starting would last approx. 14 seconds. When the measuring points are switched periodically at intervals of five seconds each time, only 3 seconds are available for starting, while 1 second is required for the printing process and 1 second for switching to the next measuring point. Consequently, the initial speed would have to be increased substantially in order that 7 $\tau$ remain smaller than 3 seconds. This yields a maximum of 0.43 seconds for $\tau$.

However, the resulting 1400 steps per second are beyond the range of the stepping motor which is used. Therefore, in the circuit arrangement which is described by way of example, the starting process is divided into two successive parts, i.e., a linear first part and an exponential second part. This ensures that the stepping motor initially operates at its maximum permissible speed of approx. 280 steps per second.

The stepping motor then operates with said constant speed until the difference frequency $\Delta f$ owing to the mutual approach of the actual position and the desired position decreases below the value of 280 Hz. This happens at a specific instant before the final value is reached and from that instant on the actual position and the desired position approach each other exponentially with decreasing speed. As soon as the two positions correspond, the difference circuit supplies no more pulses and the stepping motor and the indicating element remain stationary.

For limiting the difference frequency to 280 Hz, for example a circuit arrangement in accordance with FIG. 17 may be provided. The difference frequency $\Delta f$ is applied to the input K of a J-K flip-flop 63, which is simultaneously triggered by the actual frequency $f_{ist}$. The other input J is permanently at 1-potential (+5V). With this flip-flop each pulse, which each time has a length of only one clock period, appears at the output $\overline{Q}$ with a delay of one clock period. When at the output $\overline{Q}$ the 1 potential appears, the output Q simultaneously becomes 0, as is shown in FIG. 18. Said potential variation from 1 to 0 at the output Q, results in a following monostable 64 being triggered via its inputs 65, while its third input 66 is maintained at the 1 potential by the output 67 ($\overline{M_2}$) of a second monostable 68. At the output 69 ($M_1$) of the first monostable 64 a pulse appears whose duration has been adjusted by resistor 70 and a capacitor 71 to half the period of the maximum stepping frequency of 280 Hz.

The falling edge of said pulse triggers the second monostable 68 via its parallel connected inputs, while its third input is permanently at the 1 potential (+5V). As a result, a pulse appears at the output 72, ($M_2$) of the second monostable 68, whose duration has also been adjusted to half the period of 280 Hz by a resistor 73 and a capacitor 74.

When the output 72 ($M_2$) assumes the 1 potential, the input 75 of an AND-gate 76 also becomes 1. Simultaneously, the output 67 ($\overline{M_2}$) of the second monostable 68 becomes 0 and via the inputs 66 blocks the first monostable 64 from re-triggering during the pulse at the output 72($M_2$) of the second monostable 68.

If during said pulse a new pulse reaches the input K of the J-K flip-flop 63, the 1 potential will appear at the output Q after the next clock pulse. As a result, the output of the AND-gate 76 also becomes 1. Via a NOR-gate 77 which is connected as an inverter the set input 78 of the flip-flop 63 becomes 0. As said input influences the outputs $\overline{Q}$ and Q, the potential at the output $\overline{Q}$ remains 1 and that at the output Q remains 0, irrespective of the logic condition of the inputs K, J and 66. In other words: the flip-flop stores the first pulse that reaches its input $k$ during the period of the pulse at the output 72 ($M_2$) of the second monostable 68.

As soon as the pulse at the output 72 ($M_2$) has decayed, the set input 78 again becomes 1 and the flip-flop is unblocked.

As the conditions at the outputs $\overline{Q}$ and Q do not change until the next clock pulse ($\overline{Q}$ remains 1 and Q remains 0), the first monostable 64 is immediately retriggered owing to the simultaneous change from 0 to 1 at the input 66 of the said monostable, after which the entire process is repeated.

When during the pulse at the output 72 ($M_2$) of the second monostable no pulse reaches the input K of the flip-flop 63, its outputs remain unchanged, i.e., : $\overline{Q}$ remains 0 and Q remains 1. As a result, after the decay of the pulse at the output 72 ($M_2$) of the second monostable 68 the first monostable 64 cannot be retriggered automatically by the variation from 0 to 1 at its input 66. On the contrary, for retriggering a new pulse is required at the K-input of the flip-flop 63.

Thus, it is achieved that pulses of a repetition frequency below 280Hz (in accordance with the reciprocal of the sum of the pulse periods of the two monostables) pass the circuit without frequency variation. In contradistinction to this, all higher frequencies are limited to 280 Hz, for owing to the storage of the incoming pulses in the flip-flop 63 the one monostable immediately triggers the other. However, owing to the preset pulse periods this can happen only 280 times per second.

A stepping motor, as employed in the present circuit, is a component which in conjunction with an electrical or electronic control switch provides a direct conversion of digital electrical information (pulses) into defined mechanical angular steps. Upon each pulse applied to the control switch, the motor switch is rotated through an angle which is specific for the relevant motor.

For the operation of a stepping motor, direct currents are required which must be applied to the motor windings in a specific sequence. Suitably, electronic control switches may be employed for switching over. In FIG. 19 these are represented as mechanical switches 89, 90, 91, 92, which periodically energize the motor windings 85, 86, 87, 88. When the frequency comparator supplies no pulses, the stepping motor does not rotate. During this time the plus input of an operational amplifier 82 receives a small positive voltage via a voltage divider 80, 81, so that a high voltage of approx. +2 V exists across the emitter of the following Darlington stage 83, which serves to obtain the required holding moment. As soon as pulses are applied from the frequency comparator to the plus-input of the operational amplifier 82 via a protection diode 84, these pulses are amplified in said amplifier, so that the Darlington stage 83 is driven into full conduction and consequently the full supply voltage (approx. 12 V) appears across the energized windings. For protecting the operational amplifier 82 and the Darlington stage 83, further protection diodes 93 and 94 are provided.

Thus the power consumption becomes frequency-dependent and consequently very low when the stepping motor is stationary, and high at the maximum speed. As a result, the decrease of the torque at higher speeds is reduced.

The applied position/frequency converter is of a design known per se, so that it need not be further described.

It is to be noted that the described circuit arrangement is merely an embodiment of an apparatus which operates in accordance with the novel method. It is obvious that different frequencies may be used as basic frequencies.

What is claimed is:

1. Apparatus for indicating the value of an electric quantity comprising, means for producing a signal voltage determined by the electric quantity, means responsive to said signal voltage for converting the signal voltage into a first repetitive signal having a first frequency that is proportional to the amplitude of the electric quantity, a comparator having a first input coupled to the output of the voltage-frequency converting means, a frequency limiter having an input coupled to the output of the comparator, a servo stepping motor having a rotatable shaft connected to an indicator member, control switching means coupled between the output of the frequency limiter and an input of the stepping motor for controlling the rotation direction and speed of the motor, means responsive to the shaft position for converting the shaft position into a second repetitive signal having a second frequency that is determined by the shaft position, and mens for coupling said second signal to a second input of the comparator in a sense which tends to compensate the first signal whereby the comparator produces a difference frequency signal at the comparator output which approaches a zero value when the motor shaft corresponds to the value of the electric quantity.

2. Apparatus as claimed in claim 1 further comprising means for transposing the frequency range of said first and second repetitive signals before they are applied to the first and second comparator inputs.

3. Apparatus as claimed in claim 2 wherein said frequency transposing means comprises a frequency multiplier circuit and a frequency divider circuit for said first and second repetitive signals, respectively.

4. Apparatus as claimed in claim 1 wherein the periods of the first and second repetitive signals are linearly proportional to the signal voltage and the shaft position, respectively.

5. Apparatus as claimed in claim 1 wherein said position-frequency converting means comprises a core guided by the indicator member so as to vary the inductance of a resonant circuit.

6. Apparatus as claimed in claim 1 wherein said voltage-frequency converting means includes resistance-capacitance means for delaying frequency variations of the voltage-frequency converting means.

7. Apparatus as claimed in claim 1 wherein said comparator includes an anticoincidence circuit and a counting stage connected in cascade.

8. Apparatus as claimed in claim 1 wherein said comparator includes means for deriving a direction control signal indicative of the sign of the difference frequency signal appearing at the output of the comparator, and means for applying said direction control signal to a control input of the control switching means thereby to control the operation thereof in a positive or negative sense thus to control the direction of rotation of the stepping motor.

9. Apparatus as claimed in claim 1 further comprising an amplifier having an input responsive to said signal voltage and an output coupled to an input of the voltage-frequency converting means.

10. Apparatus as claimed in claim 9 further comprising a low-pass active filter having an upper frequency limit of approximately 2Hz and connected in cascade with said amplifier.

11. Apparatus as claimed in claim 10 wherein said amplifier comprises a chopper amplifier.

12. Apparatus as claimed in claim 1 wherein said voltage-frequency and position-frequency converting means include means for producing first and second repetitive signals having a square-wave waveform.

13. Apparatus as claimed in claim 1 further comprising means for dividing the stepping motor startup process into a linear first part and an exponential second part.

14. Apparatus as claimed in claim 1 wherein said voltage-frequency converting means produces a first square wave signal in a first frequency range and said position-frequency converting means produces a second square wave signal in a second higher frequency range, said apparatus further comprising a frequency multiplier circuit connected in cascade between the voltage-frequency converting means and the comparator for converting the first square wave signal to a third frequency range, and a frequency divider circuit connected in a cascade between the position-frequency converting means and the comparator for converting the second square wave signal to said third frequency range.

15. Apparatus as claimed in claim 14 further comprising means for coupling the second square wave signal to respective inputs of the multiplier circuit, the comparator and the frequency limiter.

16. Apparatus as claimed in claim 1 wherein said position-frequency converting means comprises a contactless digital position-frequency converter device.

* * * * *